(12) United States Patent
Momiuchi et al.

(10) Patent No.: US 6,687,273 B2
(45) Date of Patent: Feb. 3, 2004

(54) LASER OSCILLATION APPARATUS

(75) Inventors: Masayuki Momiuchi, Tokyo-to (JP); Taizo Eno, Tokyo-to (JP); Hideo Sagehashi, Tokyo-to (JP)

(73) Assignee: Kabushiki Kaisha Topcon, Tokyo-to (JP)

( * ) Notice: Subject to any disclaimer, the term of this patent is extended or adjusted under 35 U.S.C. 154(b) by 0 days.

(21) Appl. No.: 10/256,973

(22) Filed: Sep. 27, 2002

(65) Prior Publication Data

US 2003/0072338 A1 Apr. 17, 2003

(30) Foreign Application Priority Data

Oct. 12, 2001 (JP) ........................................ 2001-315819

(51) Int. Cl.[7] ................................................ H01S 3/18
(52) U.S. Cl. ............................... 372/36; 372/6; 372/107
(58) Field of Search ............................ 372/36, 43, 107, 372/108; 438/27, 31; 257/98, 797

(56) References Cited

U.S. PATENT DOCUMENTS

| | | | | | |
|---|---|---|---|---|---|
| 4,708,480 A | * | 11/1987 | Sasayama et al. | .......... | 356/464 |
| 5,515,394 A | * | 5/1996 | Zhang | .......................... | 372/72 |
| 5,790,576 A | * | 8/1998 | Waarts et al. | .................. | 372/43 |
| 6,048,105 A | * | 4/2000 | Ohtomo et al. | ................. | 385/88 |
| 6,101,203 A | * | 8/2000 | Yamamoto et al. | ........... | 372/39 |
| 6,200,309 B1 | * | 3/2001 | Rice et al. | ..................... | 606/10 |
| 2002/0019068 A1 | * | 2/2002 | Ericson et al. | ................ | 438/27 |
| 2002/0171941 A1 | * | 11/2002 | Okada | ........................ | 359/641 |

* cited by examiner

Primary Examiner—Paul IP
Assistant Examiner—Dung (Michael) T Nguyen
(74) Attorney, Agent, or Firm—Nields & Lemack

(57) ABSTRACT

A laser oscillation apparatus, comprising a laser beam emitting unit for emitting an excitation light, an optical resonance unit at least having a laser crystal and an output mirror, a plurality of optical fibers for guiding the laser beam from the laser beam emitting unit to the optical resonance unit, and a driving means for driving the laser beam emitting unit, wherein the laser beam emitting unit has a plurality of light emitting sources on a straight line, the plurality of optical fibers are arranged and held in such manner that end surfaces of the optical fibers face the plurality of light emitting sources respectively and the plurality of optical fibers makes up a fiber array unit, wherein the fiber array unit is adjustably held between a pair of wedge-shaped holders each having a cross-section in triangular form.

8 Claims, 7 Drawing Sheets

LASER OSCILLATION APPARATUS

BACKGROUND OF THE INVENTION

The present invention relates to a laser oscillation apparatus using a semiconductor laser as an excitation source.

First, general features of a laser oscillation apparatus will be described referring to FIG. 11.

FIG. 11 is a laser oscillation apparatus 1, schematically showing a laser oscillation apparatus using a second harmonic, and it comprises a laser light source 2, a condenser lens 3, a laser crystal 4, a nonlinear optical medium 5, an output mirror 6, and laser driving means 9.

The laser light source 2, the condenser lens 3, the laser crystal 4, the nonlinear optical medium 5, and the output mirror 6 having a concave reflection surface are arranged on a same optical axis 10. A first dielectric reflection film 7 is formed on a surface of the laser crystal 4 facing to the condenser lens 3, and a second dielectric reflection film 8 is formed on a concave reflection surface of the output mirror 6 facing to the nonlinear optical medium 5.

The laser light source 2 generates a laser beam. In the present embodiment, a semiconductor laser is used, and the laser light source 2 has a function as a pump light generator for generating a fundamental wave. The laser light source 2 is driven by the laser driving means 9, and the laser driving means 9 can drive the laser light source 2 by pulse driving.

The laser crystal 4 is a medium of negative temperature and it is used for amplification of the light. As the laser crystal 4, YAG (yttrium-aluminum-garnet), etc. doped with $Nd^{3+}$ ions is adopted. YAG has oscillation lines of 946 nm, 1064 nm, 1319 nm, etc. In addition to YAG, Nd with oscillation line at 1064 nm ($YVO_4$), or Ti with oscillation lines at 700 to 900 nm (Sapphire), etc. is used as the laser crystal 4.

The first dielectric reflection film 7 is highly transmissive to the laser light source 2 and is highly reflective to an oscillation wavelength of the laser crystal 4. It is also highly reflective to a second harmonic. The second dielectric reflection film 8 is highly reflective to the oscillation wavelength of the laser crystal 4 and is highly transmissive to the second harmonic.

As described above, it may be designed in such manner that the laser crystal 4 is combined with the output mirror 6, the laser beam from the laser light source 2 enters through the condenser lens 3, and the entered laser beam is reflected between the first dielectric reflection film 7 and the second dielectric reflection film 8 and is pumped to the laser crystal 4. The laser beam can be confined for a long time between the first dielectric reflection film 7 and the second dielectric reflection film 8 through the nonlinear optical medium 5. As a result, the laser beam can be resonated and amplified, and a laser beam of the second harmonic can be projected through the output mirror 6.

Brief description will be given on the nonlinear optical medium 5.

When an electric field is applied on a substance, electrical polarization occurs. When the electric field is small, the polarization is proportional to the electric field. However, in case of strong coherent light such as the laser beam, proportional relationship between the electric field and the polarization is impaired, and nonlinear polarization components proportional to square or cube of the electric field become prominent.

Therefore, in the nonlinear optical medium 5, the polarization generated by the laser beam contains a component proportional to square of the light wave electric field. By the nonlinear polarization, bonding occurs between light waves with different frequencies, and a second harmonic to double the light frequency is generated. The generation of the second harmonic is generally called "SHG (second harmonic generation)".

In the conventional example as described above, the nonlinear optical medium 5 is placed in an optical resonance unit, which comprises the laser crystal 4 and the output mirror 6, and this is called as internal type SHG. Conversion output is proportional to square of fundamental wave optoelectric power, and high light intensity in the optical resonance unit can be directly utilized.

As the nonlinear optical medium 5, for instance, KTP ($KTiOPO_4$; titanyl potassium phosphate), BBO ($\beta$-$BaB_2O_4$; $\beta$-lithium borate), LBO ($LiB_3O_5$; lithium triborate), etc. are used. Primarily, it is converted from 1064 nm to 532 nm.

$KNbO_3$ (potassium niobate), etc. is also adopted. Primarily, it is converted from 946 nm to 473 nm. In FIG. 11, $\omega$ is an angular frequency of the optical fundamental wave, and $2\omega$ is an angular frequency of the second harmonic.

In the laser oscillation apparatus using the second harmonic, for the purpose of generating a higher harmonic from the optical fundamental wave oscillating in the optical resonance unit using a nonlinear crystal (KTP crystal), the following conditions are needed:

(1) Temperature control of the nonlinear crystal (phase coordination temperature at constant level of 25° C.)

(2) Phase coordinating conditions of the nonlinear crystal which is satisfied by adjusting a nonlinear crystal axis with respect to a fundamental wave oscillation axis in the optical resonance unit.

Therefore, the laser oscillation apparatus of conventional type has a cooling mechanism and an aligning mechanism of nonlinear crystal axis.

Referring to FIG. 12, description will be given now on the cooling mechanism and the aligning mechanism of the nonlinear crystal axis used in the past.

On an optical resonator block 11 made of a material with high heat transfer property, a recessed portion 12 for accommodating a nonlinear optical medium 5 is formed. An optical path hole 13 is provided, which passes through the recessed portion 12 and has an axis aligned with an optical axis 10 of the laser oscillation apparatus. The optical path hole 13 is cut by the recessed portion 12. A laser crystal 4 is disposed on a part of the optical path hole 13 closer to an incident side, and an output mirror 6 is provided on an exit side end of the optical path hole 13. On the lower surface of the optical resonator block 11, a Peltier element 14 is fixed.

The nonlinear optical medium 5 is placed on and closely fitted to the bottom surface of the recessed portion 12. The nonlinear optical medium 5 is held at the lower end of an angle adjusting jig 15. The angle adjusting jig 15 has a knob 15a extended in a direction of $\theta$ axis 16 running perpendicularly to the optical axis 10. The knob 15a is protruded from the recessed portion 12, and an angle $\theta$ for the nonlinear optical medium 5 can be adjusted around the $\theta$ axis 16 by the knob 15a.

The nonlinear optical medium 5 is placed so that a nonlinear crystal axis of the nonlinear optical medium 5 is aligned with the optical axis 10. Because the nonlinear optical medium 5 is cut out along the nonlinear crystal axis, when the nonlinear optical medium 5 is closely fitted to the bottom surface of the recessed portion 12, the position of the nonlinear crystal axis is determined within a horizontal plane with respect to the optical axis 10. The nonlinear optical medium 5 is rotated by turning the knob 15$a$ while it is pressed against the bottom surface of the recessed portion 12, and the angle θ is adjusted so that the optical axis 10 and the nonlinear crystal axis run in parallel to each other within the same plane.

When the adjustment has been completed, the nonlinear optical medium 5 is fixed on the optical resonator block 11 by adequate means such as bonding or by a screw.

An excitation light passing through the first dielectric reflection film 7 is absorbed by the laser crystal 4. A fundamental wave oscillated by the laser crystal 4 is reflected between the first dielectric reflection film 7 and the second dielectric reflection film 8, and a second harmonic generated from the nonlinear optical medium 5 is projected through the output mirror 6.

As described above, the nonlinear optical medium 5 is a medium of negative temperature. In order to obtain predetermined stable second harmonic output, it is necessary to perform temperature control of the nonlinear optical medium 5. The nonlinear optical medium 5 is cooled down by the Peltier element 14 via the optical resonator block 11.

The temperature of the nonlinear optical medium 5 is detected by a thermister 17 installed in the optical resonator block 11. Based on the detected temperature of the thermister 17, electric current to the optical resonator block 11 is controlled, and the temperature of the nonlinear optical medium 5 is controlled via the optical resonator block 11.

In the conventional example as described above, it has been described that the nonlinear optical medium 5 is cut out in such manner that the nonlinear crystal axis of the nonlinear optical medium 5 runs in parallel to the bottom surface of the recessed portion 12. Actually, however, there are errors during cut-out operation, and the axes are not always accurately parallel to each other. In case the required output is low or in case there is some surplus in the output, it is not necessary to adjust the angle of the nonlinear optical medium 5 to the bottom surface of the recessed portion 12. However, this does not provide sufficiently high accuracy when higher output efficiency is required or in case the output near the theoretical limit is needed.

The nonlinear optical medium 5 is placed on and is closely fitted to the optical resonator block 11 via its one surface, and a heat transfer rate of the nonlinear optical medium 5 to the optical resonator block 11 is strongly influenced by contact condition of the surfaces. When the angle adjusting jig 15 is removed after once angle adjustment of the nonlinear optical medium 5 is completed, phenomenon such that the second harmonic output changes occurs. When the angle adjusting jig 15 has been separated from the nonlinear optical medium 5, which had been integrated with the angle adjusting jig 15 at the angle adjustment, transfer of heat to the angle adjusting jig 15 is lost, and the pressure from the angle adjusting jig 15 to press the nonlinear optical medium 5 is lost. As a result, changes occur in the heat transfer rate of the optical resonator block 11, and temperature distribution (temperature gradient) inside the nonlinear optical medium 5 is changed.

The output of the laser beam becomes higher in recent years, and the laser light source 2 comprises now a plurality of semiconductor lasers instead of a single semiconductor laser. As a method in order to bundle the laser beams emitted from a plurality of semiconductor lasers to a single luminous flux, such method is adopted that the laser beams emitted from the semiconductor lasers are received separately through corresponding optical fibers, and the optical fibers are bundled together to form a single cable. By this cable, the laser beams are guided to the condenser lens 3, and a single luminous flux is projected.

As described above, when a plurality of semiconductor lasers are used as laser beam emitting sources and a single luminous flux is formed by bundling optical fibers together, it is very troublesome to align optical axes of each of the semiconductor lasers and each of the optical fibers respectively. The aligning of optical axes of each of the semiconductor lasers and each of the optical fibers are 3-dimensional positioning in the directions of up-to-bottom, left-to-right, and rotation. An adjusting mechanism is also complicated. For this reason, there have been strong demands on the development of a method, by which it is possible to carry out the aligning of optical axes of a plurality of light emitting sources and a plurality of optical fibers in simple and easy manner.

SUMMARY OF THE INVENTION

It is an object of the present invention to provide a laser oscillation apparatus, by which it is possible to perform aligning of optical axes of a plurality of light emitting sources and a plurality of optical fibers by simple procedure using a simple mechanism.

To attain the above object, the laser oscillation apparatus according to the present invention comprises a laser beam emitting unit for emitting an excitation light, an optical resonance unit at least having a laser crystal and an output mirror, a plurality of optical fibers for guiding the laser beam from the laser beam emitting unit to the optical resonance unit, and a driving means for driving the laser beam emitting unit, wherein the laser beam emitting unit has a plurality of light emitting sources on a straight line, the plurality of optical fibers are arranged and held in such manner that end surfaces of the optical fibers face the plurality of light emitting sources respectively and the plurality of optical fibers makes up a fiber array unit, wherein the fiber array unit is adjustably held between a pair of wedge-shaped holders each having a cross-section in triangular form. Also, the present invention provides the laser oscillation apparatus as described above, wherein a rod lens is disposed between the light emitting source and the fiber array unit. Further, the present invention provides the laser oscillation apparatus as described above, wherein the rod lens has the same diameter as a diameter of the optical fiber. Also, the present invention provides the laser oscillation apparatus as described above, wherein the rod lens is obtained by cutting an optical fiber to a predetermined length. Further, the present invention provides the laser oscillation apparatus as described above, wherein the rod lens is bonded to the fiber array unit. Also, the present invention provides the laser oscillation apparatus as described above, wherein an end or all ends of the pair of wedge-shaped holders can be brought closer to each other or separated from each other, and angle adjustment in three directions of the fiber array unit can be carried out based on positional relationship of the pair of wedge-shaped holders. Further, the present invention provides the laser oscillation apparatus as described above, wherein the fiber array unit comprises a plurality of optical fibers and a pair of base plates each in rectangular shape to squeeze the optical fibers, wherein V-grooves parallel to each other are formed on at least one of the base plates, and the optical fibers are inserted into the V-grooves. Also, the present invention provides the laser oscillation apparatus as described above, wherein, by disposing the pair of wedge-shaped holders in V shape, the fiber array unit can be adjusted at least upward and downward.

DETAILED DESCRIPTION OF THE PREFERRED EMBODIMENT

Figure 1:
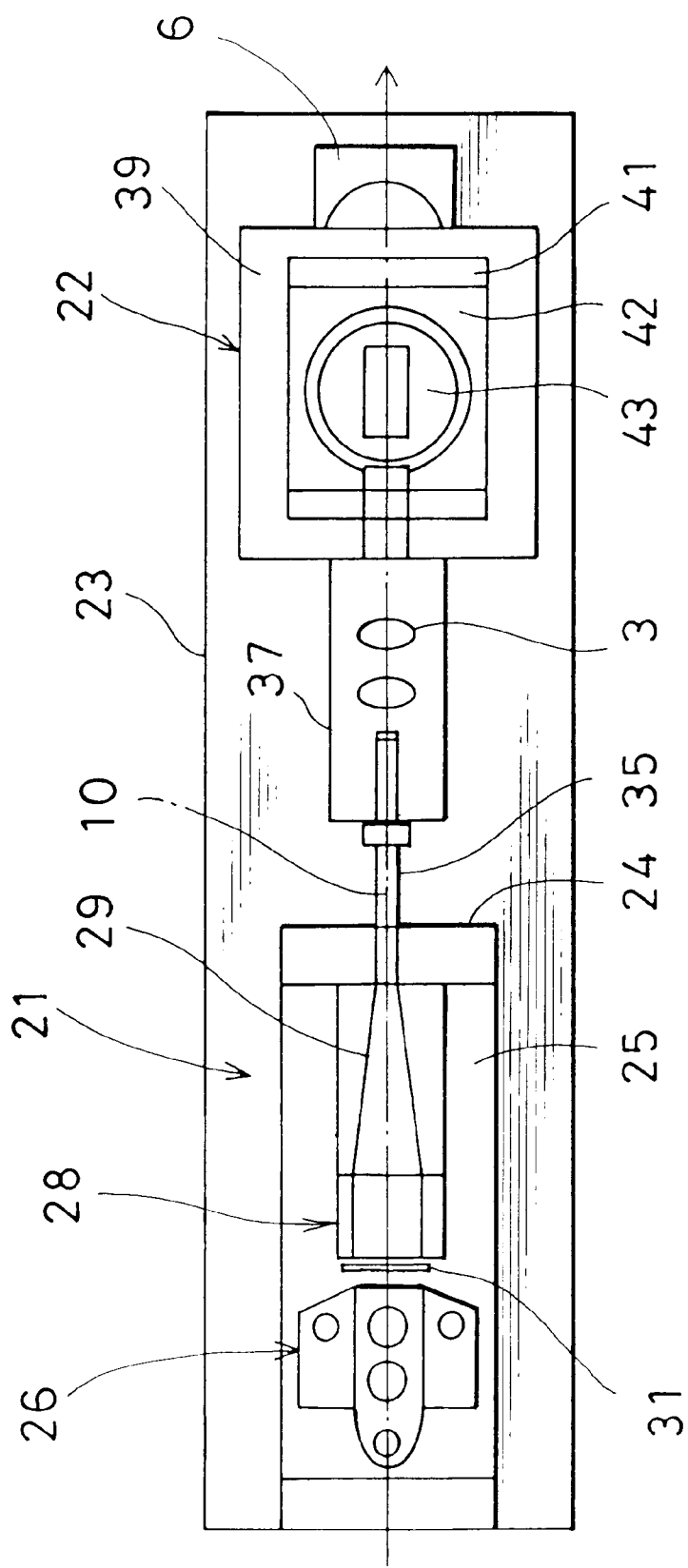
FIG. 1 is a plan view of an entire arrangement of an embodiment of the present invention.

Description will be given below on an embodiment of the present invention referring to the drawings.

Figure 2:
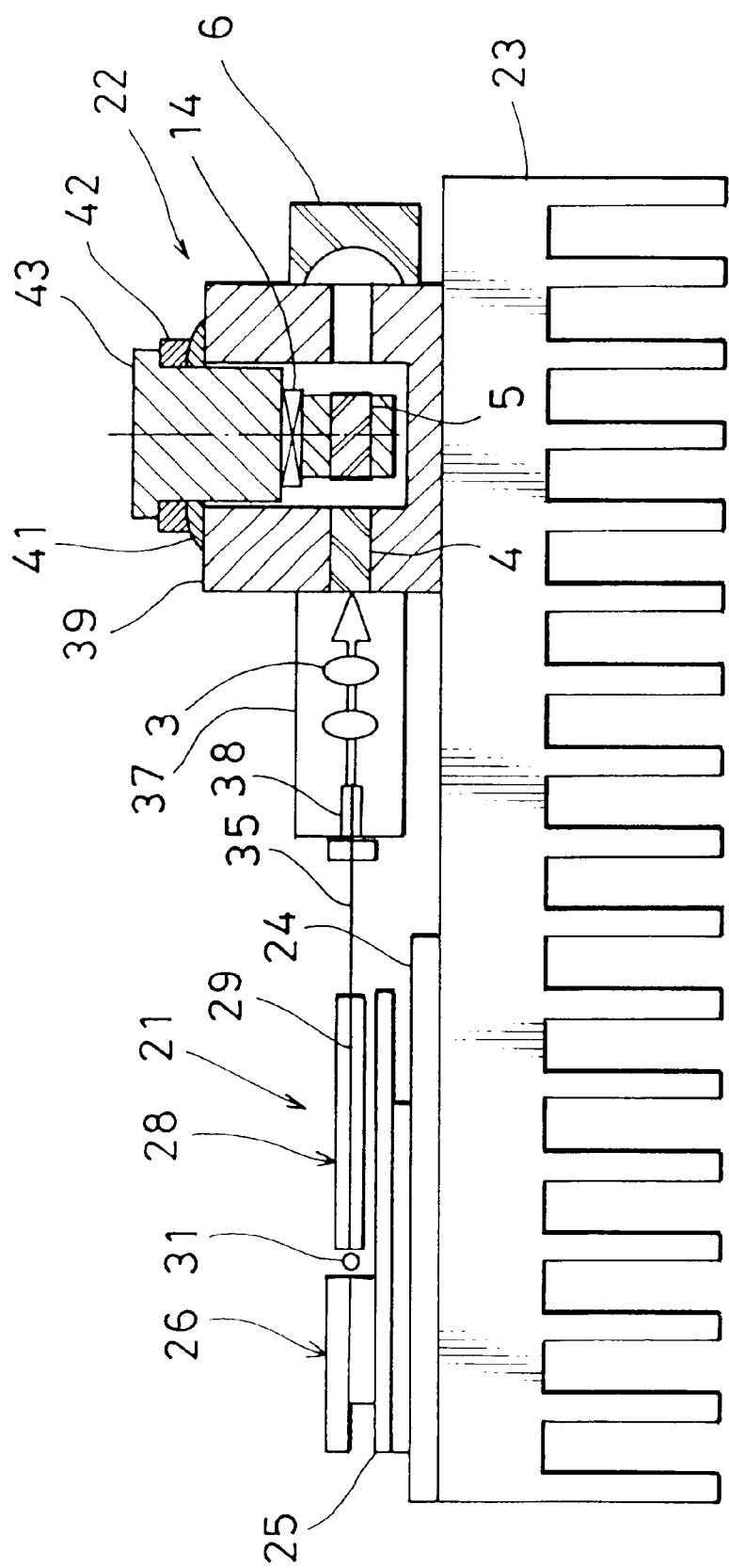
FIG. 2 is a front view of the same.
Figure 3:
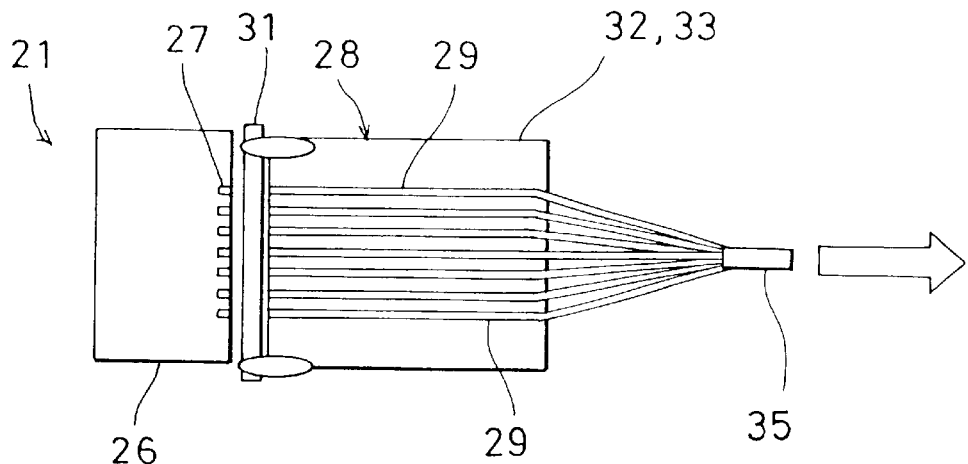
FIG. 3 is a plan view of a laser beam emitting unit of the embodiment of the present invention.
Figure 4:
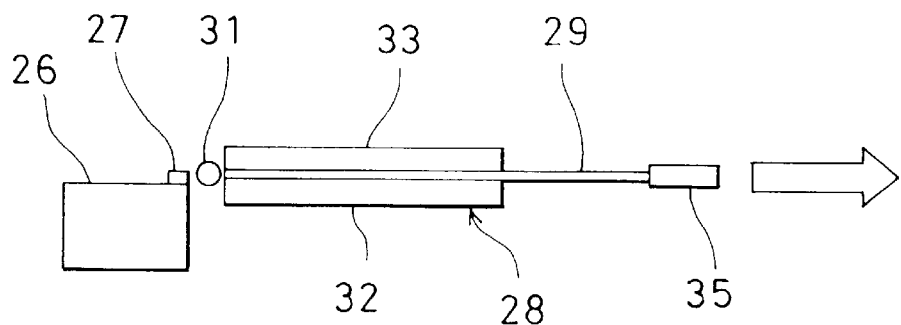
FIG. 4 is a front view of the laser beam emitting unit.
Figure 5:
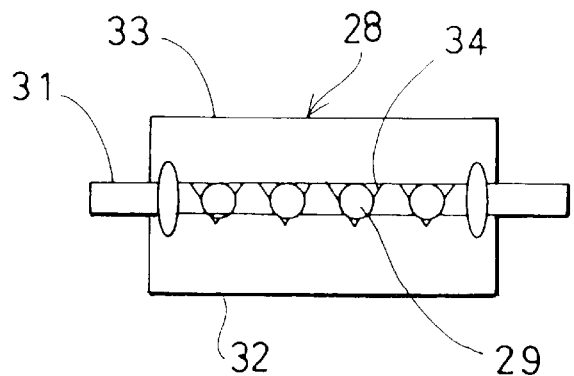
FIG. 5 is a side view of the laser beam emitting unit.

FIG. 1 and FIG. 2 each represents an entire arrangement of a mechanism of a laser oscillation apparatus.

A laser beam emitting unit 21 and an optical resonance unit 22 are fixed on a base 23, which serves as a heat sink. The laser beam emitting unit 21 and the optical resonance unit 22 are arranged on an optical axis 10, and a lens unit 37 is disposed between the laser beam emitting unit 21 and the optical resonance unit 22.

Now, description will be given on the laser beam emitting unit 21 referring to FIG. 3 to FIG. 8.

A light source unit base 25 is mounted on the base 23 via a light source base 24 (FIGS. 1 and 2), and a light source unit 26 is fixed on the light source unit base 25. The light source unit 26 is provided with a plurality of semiconductor lasers 27, and the semiconductor lasers 27 are disposed in a linear direction.

Opposite to the light source unit 26, a fiber array unit 28 is mounted on the light source unit base 25. The fiber array unit 28 is provided with as many optical fibers 29 as the semiconductor lasers 27.

Now, description will be given on the fiber array unit 28.

The optical fibers 29 are sandwiched between a V-grooved base plate 32 and a holding plate 33. On the V-grooved base plate 32, as many V-grooves 34 as the optical fibers 29 are formed and the V-grooves 34 run in parallel to the optical axis 10. Because the optical fibers 29 are inserted and held in the V-grooves 34, the optical fibers 29 are maintained in parallel to each other.

The optical fibers 29 held by the V-grooved base plate 32 and the holding plate 33 are extended toward the optical resonance unit 22 and are bundled in cylindrical form. Then, the optical fibers 29 are extended to the optical resonance unit 22 as a fiber cable 35, and an end surface of the fiber cable 35 is fixed in such manner as to face the condenser lens 3.

All of the optical fibers 29 are sandwiched between the V-grooved base plate 32 and the holding plate 33 and are integrated. To perform the positioning for each of the optical fibers 29 with the semiconductor laser 27, a position of the light source unit 26 should be aligned with a position of the fiber array unit 28, or positioning should be performed either for the light source unit 26 or for the fiber array unit 28. In the following, description will be given on a case where the positioning of the fiber array unit 28 can be performed.

The fiber array unit 28 is mounted on the light source unit base 25 via a pair of wedge-shaped holders 36a and 36b, which are disposed at left and right respectively and are arranged in the direction of the optical axis 10.

Each of the wedge-shaped holders 36a and 36b has a cross-section in triangular form, or more preferably in form of an isosceles triangle. The fiber array unit 28 is held between the wedge-shaped holders 36a and 36b in such manner that each of lateral ends of the fiber array unit 28 is brought into contact with the middle point on each of inclined surfaces of the wedge-shaped holders 36a and 36b, which are facing to each other.

Figure 8:
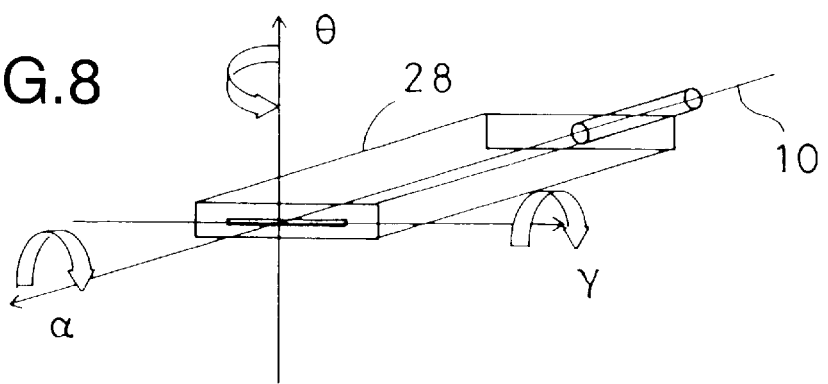
FIG. 8 is a drawing to show a direction of positional adjustment of the fiber array unit.

As shown in FIG. 8, by adjusting the positions of the wedge-shaped holders 36a and 36b, angular adjustment of the fiber array unit 28 can be performed in three angles: an angle $\theta$ around $\theta$ axis running in a vertical direction, a rotating angle $\alpha$ around the optical axis 10, and an angle $\gamma$ around $\gamma$ axis, which runs perpendicularly to both the optical axis 10 and $\theta$ axis.

Now, detailed description will be given referring to FIGS. 6, 7 and 8.

First, it is assumed that the wedge-shaped holders 36a and 36b are disposed in parallel to each other along the optical axis 10.

Figure 6:
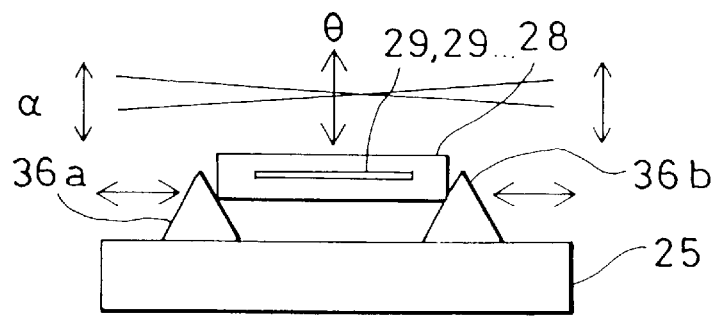
FIG. 6 is a drawing to explain a fiber array unit of the embodiment of the present invention.

In case the angle $\alpha$ is adjusted, e.g. in case the angle $\alpha$ is adjusted in a clockwise direction in FIG. 6, if the right end of the fiber array unit 28 is moved down along the inclined surface of the wedge-shaped holder 36b, the left end of the fiber array unit 28 is displaced upward along the inclined surface of the wedge-shaped holder 36a to an extent equal to the extent of downward displacement of the right end. As a result, the angle $\alpha$ is adjusted. As described above, in case each of the wedge-shaped holders 36a and 36b have a cross-section of the same isosceles triangle, an amount of displacement at left is equal to an amount of displacement at right.

Figure 7A:
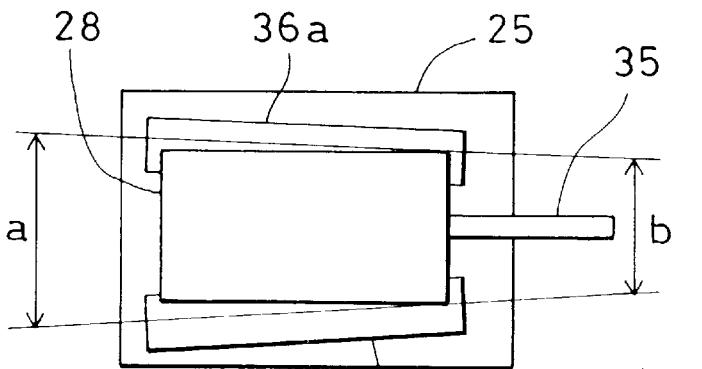
FIG. 7(A) and FIG. 7(B) each represents a drawing to explain positional adjustment of the fiber array unit.
Figure 7B:
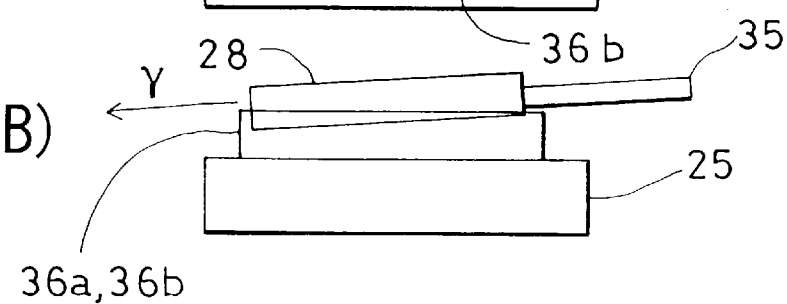

In case the angle $\gamma$ is adjusted, e.g. in case the angle $\gamma$ is adjusted in a counterclockwise direction in FIG. 7 (B), a distance "a" between the wedge-shaped holders 36a and 36b on a side closer to the light source unit 26 is widened compared with a distance "b" on a side closer to the optical resonance unit 22 in FIG. 7 (A) in such manner that the wedge-shaped holders 36a and 36b are disposed in V shape. With respect to the widening of the distance between the wedge-shaped holders 36a and 36b, each point on the fiber array unit 28 is displaced downward in such extent as to match a tangent component of a tilt angle on the inclined surface of each of the wedge-shaped holders 36a and 36b. That is, the angle $\gamma$ is adjusted.

In case the angle $\theta$ is adjusted, the fiber array unit 28 should be rotated around the $\theta$ axis while maintaining the relationship of the wedge-shaped holders 36a and 36b.

In the above explanation, the wedge-shaped holders 36a and 36b are disposed in parallel to the optical axis 10, while it is needless to say that the adjustment can also be made in the same manner when the holders are arranged in a direction perpendicular to the optical axis 10.

When the adjustment of the fiber array unit 28 has been completed, the wedge-shaped holders 36a and 36b are fixed by adequate means such as bonding on the light source unit base 25.

A rod lens 31 is mounted in parallel to end surfaces of the optical fibers 29 of the fiber array unit 28 by bonding. As a method of bonding, UV-bonding not causing thermal distortion is used. As the rod lens 31, a core portion of the optical fiber 29 is cut off in an adequate length and is used. The rod lens 31 can effectively converge the laser beams to each of the optical fibers 29, and it can be manufactured in easy manner and is not expensive. It is of course satisfactory that a rod lens having the same diameter as a diameter of the optical fiber 29 may be separately manufactured and used.

By bonding the rod lens 31 to the fiber array unit 28, optical relation between the rod lens 31 and the fiber array unit 28 can be maintained and integrally adjusted, and this facilitates the execution of the adjusting procedure.

A luminous flux of the laser beam emitted from each of the semiconductor lasers 27 has an elliptic cross-section. When the light beams are converged in one direction by the rod lens 31, it is possible to project a luminous flux with a cross-section closer to a true circle to the optical fiber 29, and this reduces the loss of the laser beams when the beams are projected to the optical fibers 29. The position of the fiber array unit 28 can be adjusted completely in directions of the three axes with respect to the light source unit 26, and this reduces the loss due to giving and receiving of the laser beams between the light source unit 26 and the fiber array unit 28.

Figure 9:
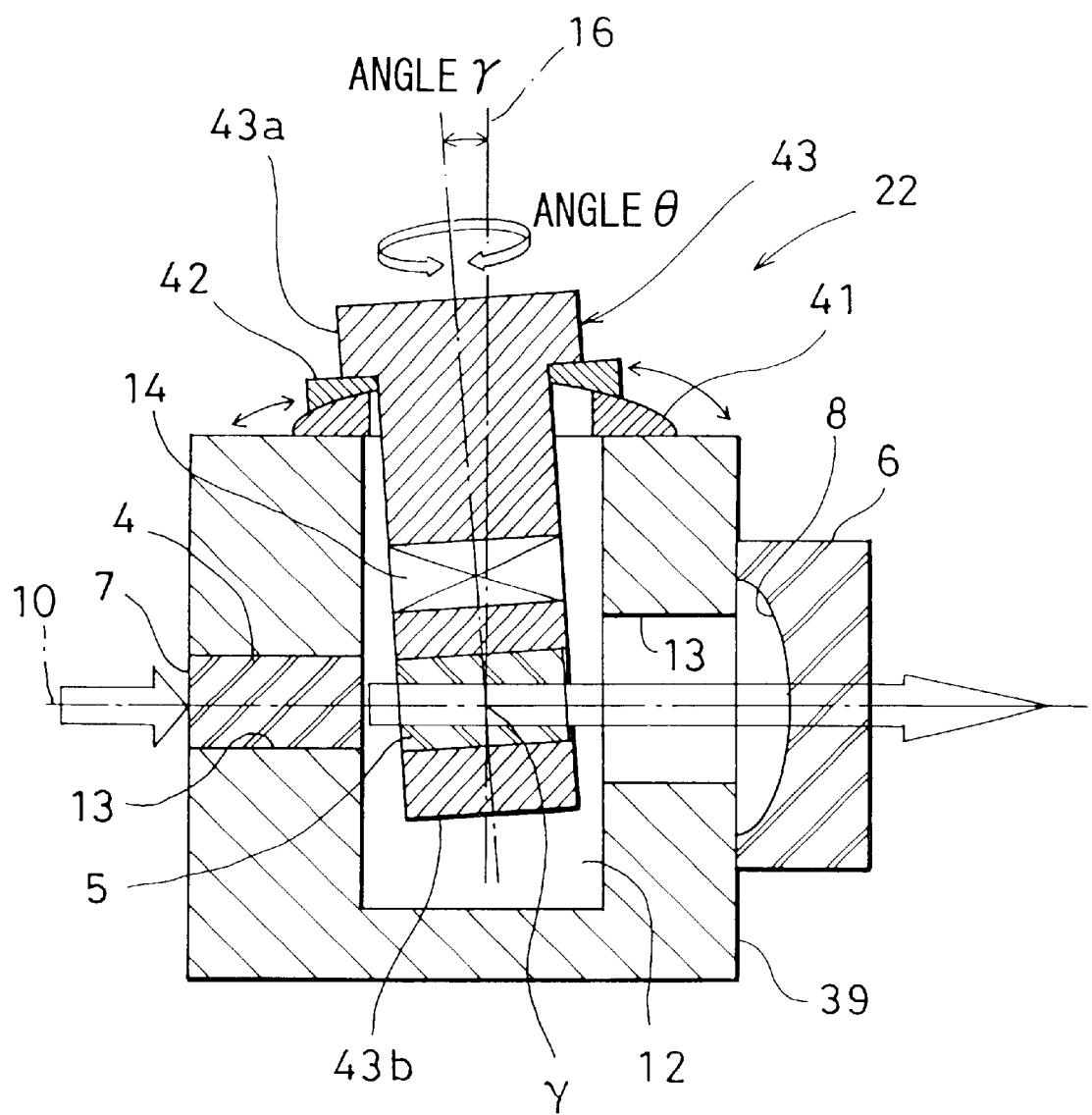
FIG. 9 is a cross-sectional view of an optical resonance unit of the embodiment of the present invention.
Figure 10:
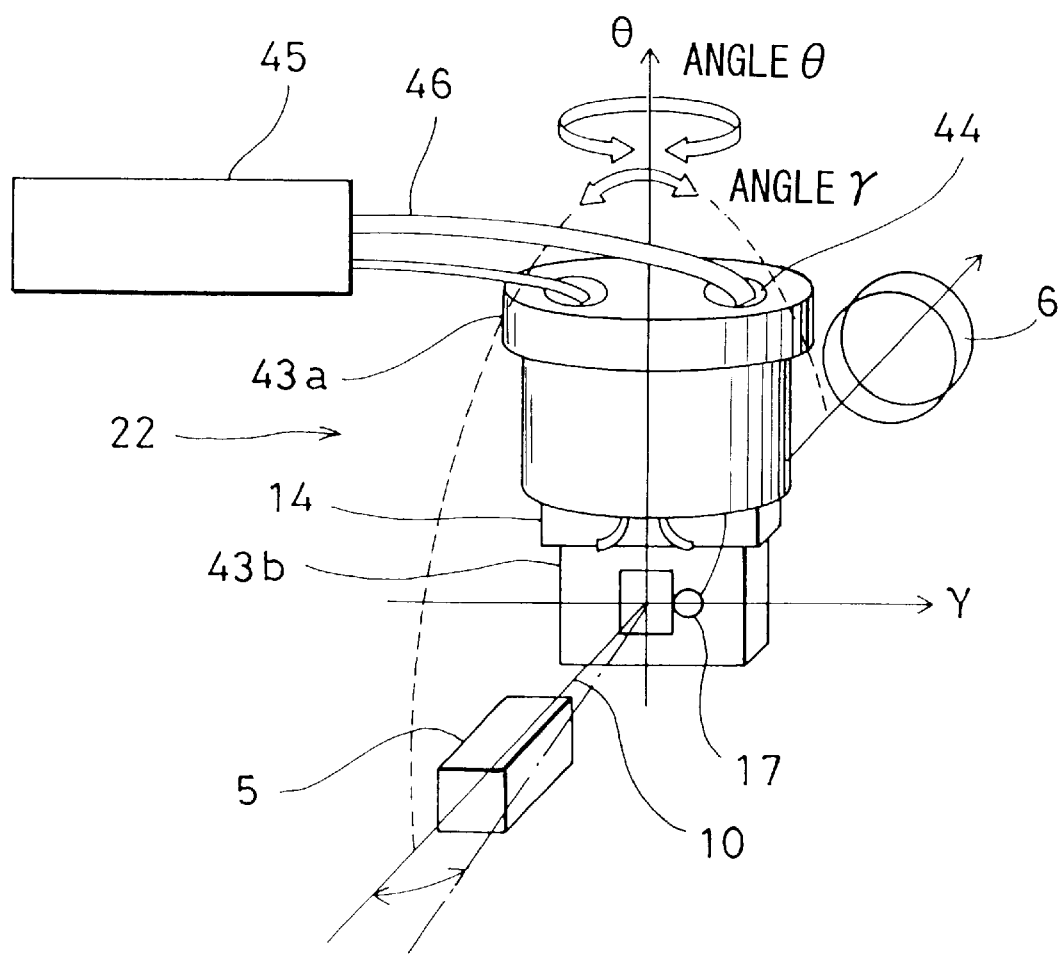
FIG. 10 is a perspective view of the optical resonance unit of the embodiment of the present invention.
Figure 11:
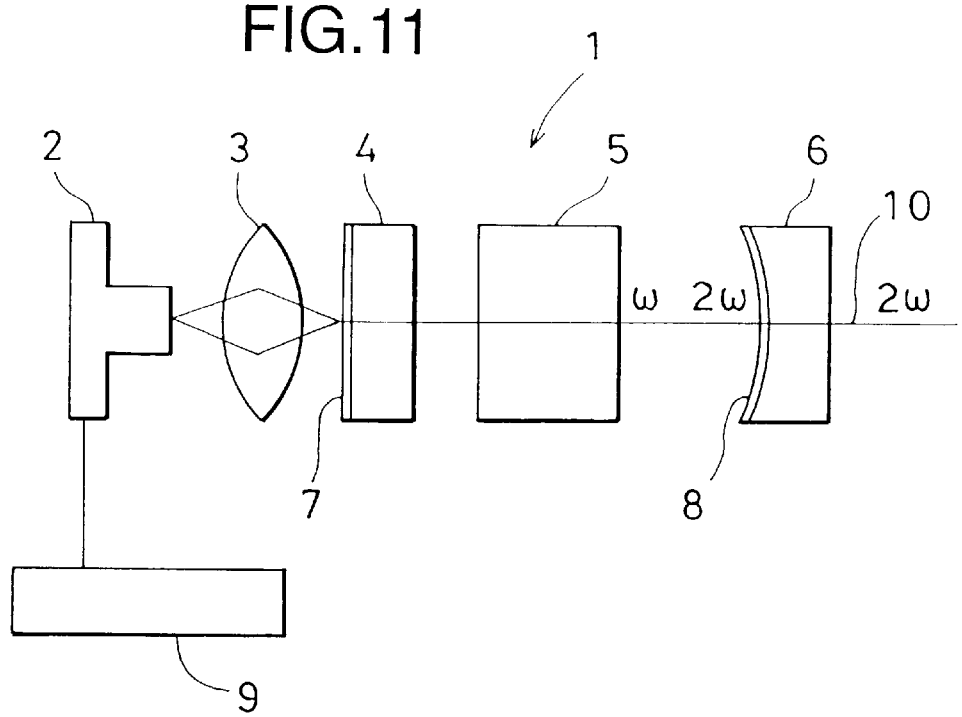
FIG. 11 is a schematical drawing of a basic arrangement of the optical resonance unit of a laser oscillation unit.
Figure 12:
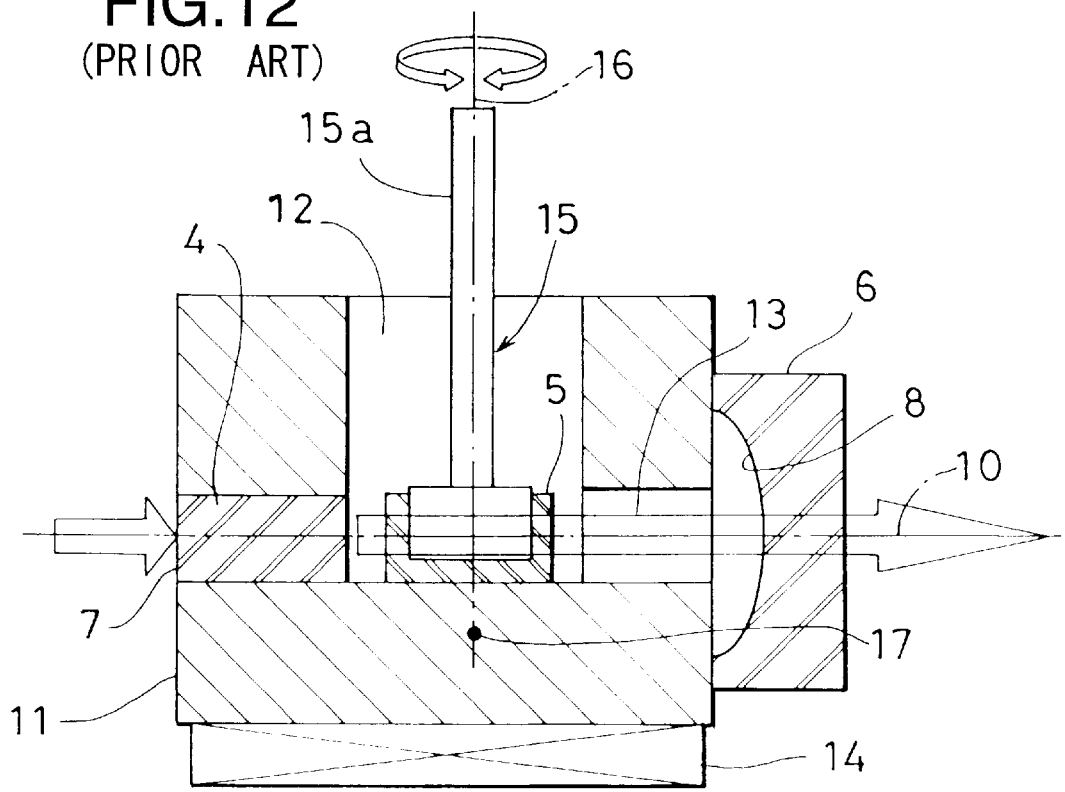
FIG. 12 is a cross-sectional view of a conventional type optical resonance unit.

Description will be given on the optical resonance unit 22 referring FIG. 9 and FIG. 10. In FIG. 9 and FIG. 10, the same component in FIG. 11 or FIG. 12 is referred by the same symbol.

The lens unit 37 provided with the condenser lens 3 is mounted on a side of the optical resonance unit 22 closer to the laser beam emitting unit 21. On the lens unit 37, a tip of the fiber cable 35 is mounted via a cable holder 38. An optical axis of the fiber cable 35 is aligned with an optical axis of the condenser lens 3.

An optical resonator block 39 is fixed on the base 23. A recessed portion 12 is formed from above on the optical resonator block 39, and an optical path hole 13 passing through the recessed portion 12 is formed with its axis aligned with the optical axis 10. A laser crystal 4 is provided on a portion of the optical path hole 13 closer to the condenser lens 3. A first dielectric reflection film 7 is formed on an end surface of the laser crystal 4 closer to the condenser lens 3. An output mirror 6 is arranged on an exit end of the optical path hole 13, and a second dielectric reflection film 8 is formed on a concave reflection surface of the output mirror 6.

The upper surface of the optical resonator block 39 runs in parallel to the surface of the base 23 where the optical resonator block 39 is mounted, and a convex cylindrical curved seat 41 is fixed on the upper surface of the optical resonator block 39. The convex cylindrical curved seat 41 is designed in such shape that a part of a cylinder is cut off by a plane running in parallel to the central line of the cylinder, and it is mounted in a direction perpendicular to the optical axis 10.

A concave cylindrical curved seat 42 is slidably engaged with the convex cylindrical curved seat 41, and a nonlinear optical medium holder 43 is mounted on the concave cylindrical curved seat 42. The center of a cylindrical curved surface of each of the convex cylindrical curved seat 41 and the concave cylindrical curved seat 42 is on the optical axis 10.

As the nonlinear optical medium holder 43, a material having high heat transfer property or, preferably, having lower thermal expansion coefficient is used. The nonlinear optical medium holder 43 is rotatably engaged with the concave cylindrical curved seat 42 and the non linear optical medium holder 43 is passing through the convex cylindrical curved seat 41 with a certain clearance or play. A lower portion 43b of a flange 43a is accommodated in the recessed portion 12. An upper end of the nonlinear optical medium holder 43 is exposed above the concave cylindrical curved seat 42, and the exposing portion is the flange 43a. This is used as a knob when the nonlinear optical medium holder 43 is to be rotated. On the upper surface of the flange 43a, slit grooves (not shown) may be formed to enable the adjustment using tools.

At a position on the lower portion 43b where the optical axis 10 passes through, a nonlinear optical medium 5 is provided in such manner that 4 surfaces except surfaces running perpendicularly to the optical axis 10 are closely fitted to the lower portion 43b and a Peltier element 14 is mounted on upper side of the nonlinear optical medium 5. The Peltier element 14 is provided in such manner that it is squeezed at the middle of the lower portion 43b or it is engaged in a mounting hole formed on the lower portion 43b. At least, two surfaces on upper and lower sides are closely fitted to the lower portion 43b.

On the nonlinear optical medium holder 43, wiring holes 44 running in parallel to a central axis are formed from above and extended until the holes reach the Peltier element 14. Lead wires 46 guided from a temperature controller 45 are connected to the Peltier element 14 through the wiring holes 44. A thermister 17 is arranged at a predetermined position on the nonlinear optical medium holder 43, or more preferably, at a position closer to the nonlinear optical medium 5.

The nonlinear optical medium holder 43 can be rotated around the axis of the nonlinear optical medium holder 43 integrally with the Peltier element 14 and the nonlinear optical medium 5. Further, it can also be rotated around γ axis, which passes through the optical axis 10.

Deviation of the nonlinear crystal axis of the nonlinear optical medium 5 from the optical axis 10 exerts influence on the output of the laser oscillation apparatus. The sensitivity to the deviation of the nonlinear crystal axis of the nonlinear optical medium 5 from the optical axis 10 differs according to the axial direction. In the above embodiment, the adjustment on the angle α is omitted, at which the influence of the deviation of the nonlinear crystal axis is at the lowest. Thus, efficiency can be sufficiently increased only by making it possible to adjust the angle γ in addition to the angle θ. By omitting the adjustment for the angle α, it is possible to simplify the structure and the adjusting procedure. If the efficiency is improved more, a convex curved seat and a concave curved seat having spherical curved surfaces may be used instead of the convex crylindical curved seat 41 and the concave cylindrical curved seat 42. Then, the nonlinear optical medium holder 43 can be also rotated around α axis. Thus, it is possible to perform angular adjustment in three directions of the angles θ, γ and α, and the nonlinear crystal axis can be aligned more perfectly.

As described above, the adjustment of the angle γ can also be achieved, and it is possible to adjust including the correction of error during the cut-out operation of the nonlinear optical medium 5. This makes it possible to strictly satisfy phase coordinating condition of the nonlinear crystal of the nonlinear optical medium 5. As a result, output efficiency can be increased up to near the output of the theoretical limit.

The nonlinear optical medium 5 is engaged in the lower portion 43b, and the Peltier element 14 is integrally incorporated in the lower portion 43b. Heat transfer area of the nonlinear optical medium holder 43 between the nonlinear optical medium 5 and the Peltier element 14 is big. Heat transfer surface contact pressure can be determined at the time of incorporation, and a stable heat transfer rate can be ensured. Therefore, cooling effect on the nonlinear optical medium 5 by the Peltier element 14 is high. The nonlinear optical medium 5 and the Peltier element 14 are integrated with the nonlinear optical medium holder 43, and holding conditions of the nonlinear optical medium 5 and the Peltier element 14 are not changed after the adjustment. Accordingly, no change occurs in the cooling condition due to the Peltier element 14 after the adjustment.

Temperature control of the nonlinear optical medium 5 can be easily adjusted, and the accuracy during operation is also improved.

In the above embodiment, a nonlinear optical medium generating a second harmonic is used, while it is needless to say that the same results and effects can be obtained when a nonlinear optical medium generating a sum frequency wave or a difference frequency wave is used.

As described above, energy utilization efficiency is improved by optical axis alignment between the light source unit 26 and the fiber array unit 28 and by accurate alignment of the nonlinear crystal axis of the nonlinear optical medium 5 with the optical axis 10, while energy utilization efficiency can also be improved by reducing reflection loss of the optical system.

Reflection loss on an entrance surface and an exit surface when a laser beam enters and exits an optical member is about 4% on each of the surfaces. This reflection loss occurs at the same number as the number of optical members. This is a considerable loss if it is seen from the entire optical system.

Therefore, AR coating is provided on end surfaces of the rod lens 31 and the optical fibers 29 in the above embodiment.

As the means for performing AR coating, there are the following methods: to directly form a dielectric thin film on the end surface by vacuum deposition or by ion plating; or, to mount a cover glass with AR coating on the end surface, etc. Because the rod lens 31 and the optical fibers 29 are made of synthetic resin and these are thin, each having a diameter of several tens of μm to 500 μm. In this respect, the following method is adopted to avoid the damage of the material.

The end surface of the optical fiber is immersed into a solution of a fluorine type compound, and after it is taken up, it is dried and hardened. In this case, concentration of the solution and the take-up speed should be selected to have such refractive index and coating thickness that AR effects can be obtained in the wavelength range in use. By this method, it is possible to form AR coating very easily with reflectivity of 1% or less—not only on the end surface of the optical fiber but also on a cylindrical surface of the optical fiber. In the past, for providing AR coating to a cylindrical surface of a very small cylindrical lens, etc., special type tools have been needed in a vacuum apparatus. By the method to immerse the end surface of the optical fiber into the solution of the fluorine type compound and to dry and harden after it is taken up, the procedure can be easily performed under atmospheric pressure. Further, by adjusting the take-up speed or the solution concentration, it is possible to obtain multi-coating with reflectivity of 0.5% or less by repeating the procedure by two or more times.

Naturally, it is possible to control the reflectivity by changing the conditions of the solution (concentration; refractive index). For instance, it is possible to obtain a reflection film with reflectivity of 50% or 80%.

As a result, reflection loss as high as 8% to 10% on the entrance and exit end surfaces can be improved, and energy utilization efficiency is increased. Thus, the trouble such as damage of the optical system due to the reflection light can be extensively reduced.

The laser oscillation apparatus according to the present invention comprises a laser beam emitting unit for emitting an excitation light, an optical resonance unit at least having a laser crystal and an output mirror, a plurality of optical fibers for guiding the laser beam from the laser beam emitting unit to the optical resonance unit, and a driving means for driving the laser beam emitting unit, wherein the laser beam emitting unit has a plurality of light emitting sources on a straight line, the plurality of optical fibers are arranged and held in such manner that end surfaces of the optical fibers face the plurality of light emitting sources respectively and the plurality of optical fibers makes up a fiber array unit, wherein the fiber array unit is adjustably held between a pair of wedge-shaped holders each having a cross-section in triangular form. By adjusting positional relationship between the pair of wedge-shaped holders or by adjusting positional relationship of the fiber array unit with respect to the pair of wedge-shaped holders, it is possible to adjust the fiber array unit with respect to the laser beam emitting unit in directions of three axes. As a result, positioning of the laser beam emitting unit and the fiber array unit can be carried out by simple adjustment procedure using a simple mechanism.

A rod lens is disposed between the light emitting source and the fiber array unit. As a result, laser beams from all light emitting sources are converged to end surfaces of all optical fibers.

Because the rod lens is obtained by cutting an optical fiber to a predetermined length, it is obtained at inexpensive cost.

Further, the rod lens is bonded to the fiber array unit, and this makes it possible to perform the positioning of the fiber array unit and the rod lens at the same time, and this contributes to easier execution of the adjusting procedure.

What is claimed is:

1. A laser oscillation apparatus, comprising a laser beam emitting unit for emitting an excitation light, an optical resonance unit at least having a laser crystal and an output mirror, a plurality of optical fibers for guiding the laser beam from said laser beam emitting unit to said optical resonance unit, and a driving means for driving said laser beam emitting unit, wherein said laser beam emitting unit has a plurality of light emitting sources on a straight line, said plurality of optical fibers are arranged and held in such manner that end surfaces of said optical fibers face said plurality of light emitting sources respectively and said plurality of optical fibers makes up a fiber array unit, wherein said fiber array unit is adjustably held between a pair of wedge-shaped holders extending in a direction of an optical axis and each having inclined surfaces and a cross-section in triangular form, said fiber array unit being held so as to be brought into contact said inclined surfaces of said wedge-shaped holders facing each other, wherein optical axes of said fiber array unit and said light emitting sources are aligned by adjusting the positional relationship of said pair of wedge-shaped holders.

2. A laser oscillation apparatus according to claim 1, wherein a rod lens is disposed between said light emitting source and said fiber array unit.

3. A laser oscillation apparatus according to claim 2, wherein said rod lens has the same diameter as a diameter of the optical fiber.

4. A laser oscillation apparatus according to claim 2, wherein said rod lens is obtained by cutting an optical fiber to a predetermined length.

5. A laser oscillation apparatus according to claim 2, wherein said rod lens is bonded to said fiber array unit.

6. A laser oscillation apparatus according to claim 1, wherein an end or all ends of said pair of wedge-shaped holders can be brought closer to each other or separated from each other, and angle adjustment in three directions of said fiber array unit can be carried out based on positional relationship of said pair of wedge-shaped holders.

7. A laser oscillation apparatus according to claim 1, wherein, by disposing said pair of wedge-shaped holders in V shape, said fiber array unit can be adjusted at least upward and downward.

8. A laser oscillation apparatus according to claim 1, wherein said pair of wedge-shaped holders are mounted on a base, and adjustment of said optical axes is made by rotating said fiber array unit while maintaining the relationship of said pair of wedge-shaped holders.

* * * * *